COMPONENT DELIVERY AND CUTOFF APPARATUS

Filed Sept. 21, 1960 4 Sheets-Sheet 1

INVENTORS
THEODORE H. COLE
NORMAN MAC DONALD JR.
BY Donald F. Voss
ATTORNEY

COMPONENT DELIVERY AND CUTOFF APPARATUS

Filed Sept. 21, 1960 4 Sheets-Sheet 2

Oct. 9, 1962 T. H. COLE ET AL 3,057,528

COMPONENT DELIVERY AND CUTOFF APPARATUS

Filed Sept. 21, 1960 4 Sheets-Sheet 3

United States Patent Office 3,057,528
Patented Oct. 9, 1962

3,057,528

COMPONENT DELIVERY AND CUTOFF APPARATUS

Theodore H. Cole and Norman MacDonald, Jr., Endicott, N.Y., assignors to International Business Machines Corporation, New York, N.Y., a corporation of New York Filed Sept. 21, 1960, Ser. No. 57,436
5 Claims. (Cl. 226—37)

This invention relates to apparatus for transporting articles linked in spaced relationship by carrier strips and, more particularly, to apparatus for transporting axial lead components linked in spaced relationship by tapes adherent to the leads to a station for severing the component leads from the tapes.

The invention is particularly suited to be incorporated in machines for automatically inserting axial lead components into electronic assemblies. Machines for automatically inserting axial lead components into electronic assemblies have been developed to a high degree. The present invention is an improvement over the devices heretofore known for delivering axial lead components from a supply to the head for inserting the components into the electronic assembly. It is a common practice to link components of a particular size and function in spaced relationship by means of tapes extending across and adherent to the leads of the components which are reeled to provide a convenient form for storage. In this manner, there is less tendency for the axial leads of the components to become bent or otherwise mutilated. The component insertion head normally would be unable to insert components having bent or mutilated leads.

To satisfy the requirements of the automatic machinery for inserting the axial lead components into the component insertion head, it is necessary for one of the components to be removed from the supply and disconnected from the tapes linking it in spaced relationship relative to the other components and deliver the free component to the insertion head. In the past the lead component of the reel of components linked by the tapes has been brought into cutoff position by means of sprockets having teeth which engage the leads of the components and thereby drive the components into cutoff position. The drive to the sprockets was established through a notched disk driven by a cam-actuated escapement indexing pawl. By cutting the leads of the component adjacent to the tapes adherent to the leads, the component becomes free of the tapes and is permitted to drop into a chute or carrier which then transports the component to the component insertion head. However, this type of drive and cutoff arrangement has a tendency to damage the leads. Further, there was no provision for automatically aligning a skewed component.

Briefly, the present invention involves a pair of parallel spaced endless belts having a resilient outwardly facing surface for engaging the tapes linking the components. The parallel spaced endless belts are trained about a series of pulleys disposed in a triangular configuration. The reel of belted components is suitably disposed so that the taped portion of the axial leads of the components may be pulled onto the endless belts. The tapes adherent to the axial leads of the leading component are engaged by pressure plates which function to establish a frictional driving relationship between the outwardly facing surface of the endless belts and the tapes linking the axial leads of the components. Each belt is driven from a common source through an associated clutch assembly. When a component is driven into cutoff position, the leads of the component actuate electrical switches. A separate electrical switch is associated with each axial lead. When the electrical switches having normally closed contacts are operated by the leads of the component, associated solenoids are de-energized to permit springs to actuate members to detent the clutches, thereby discontinuing the drive to the belts. Since each clutch operates to cause the associated axial lead to be driven into cutoff position, a component that is skewed will align itself automatically. With the leading component in cutoff position, a punch for shearing the component leads from the taped portions may be actuated selectively at any time. When a component in cutoff position is severed so as to become free of the tapes, the electrical switches are permitted to return to the unoperated position, thereby causing the solenoids to become energized to disengage the detents from the clutches. With the clutches free, the belts drive the new leading component into cutoff position. The new leading component is then detented in the cutoff position because the axial leads thereof actuate the electrical switches to cause the solenoids to become de-energized, thereby permitting the clutches to be detented.

Accordingly, a prime object of the invention is to provide an improved arrangement of apparatus for transporting axial lead components linked in spaced relationship by tapes adhering to the leads thereof to a station for severing the component leads from the tapes.

Another important object of the invention is to provide apparatus which automatically aligns a skewed axial lead component in cutoff position.

Still another important object of the invention is to provide apparatus for bringing axial lead components linked in spaced relationship with tapes adherent to the leads into cutoff position without damage to the leads of the components.

The foregoing and other objects, features and advantages of the invention will be apparent from the following more particular description of a preferred embodiment of the invention, as illustrated in the accompanying drawings.

Figure 1:
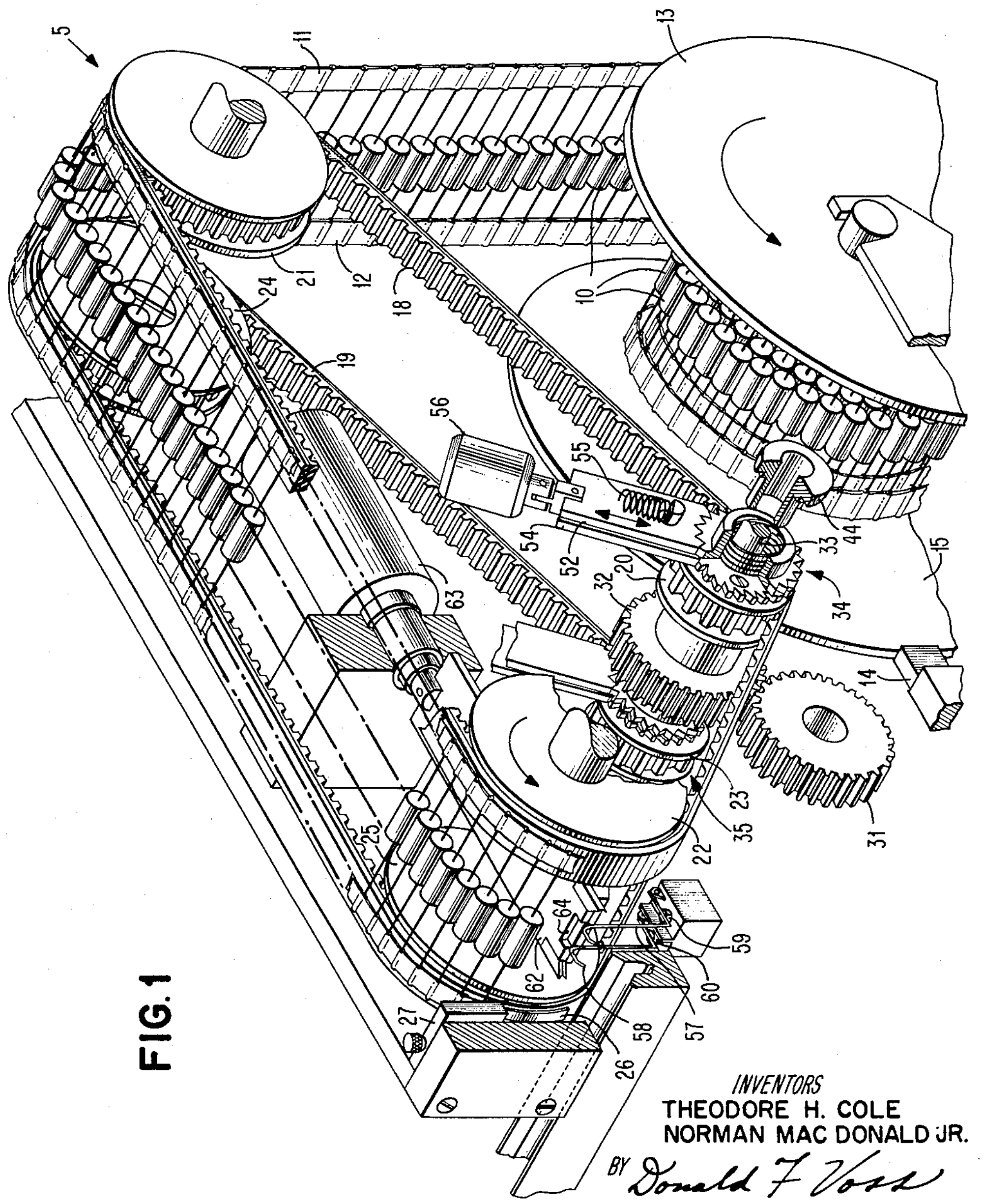
FIG. 1 is a perspective view of the apparatus for bringing the axial lead components linked in spaced relationship by tapes adherent to the leads into cutoff position.

Referring to the drawings and particularly to FIG. 1, the invention is illustrated by way of example as a component supply, delivery and cutoff unit 5 for transporting axial lead components 10 linked in spaced relationship by tapes 11 and 12 from a supply reel 13 to a cutoff station S. The supply reel 13 of axial lead components 10 is cradled in a suitable manner to permit rotation thereof. Generally, the reel of components does not have a tendency to overrun; however, a drag is placed upon the reel by means of a friction brake 14 disposed to engage the outer periphery of flange 15 of the reel 13.

Figure 8:
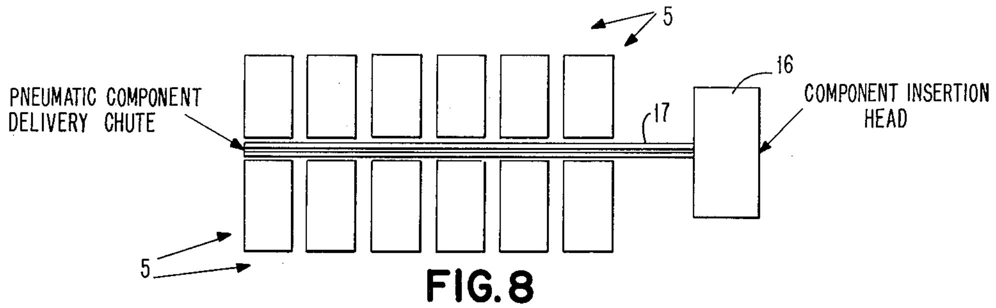
FIG. 8 is a schematic diagram showing the invention as incorporated in an automatic component insertion machine; and, FIG. 9 is a partial plan view of the cutoff mechanism for severing the axial leads of the components.

The detailed description of the invention will be more understandable by a brief description of an automatic component assembly machine incorporating the invention as schematically illustrated in FIG. 8. The automatic component insertion machine includes a component insertion head 16 for inserting electronic components 10 into dielectric panels, not shown, carrying conductors adherent thereto. Whenever a component is to be inserted into one of the dielectric panels properly positioned relative to the component insertion head 16, a control unit, not shown, signals one of the component supply, delivery and cutoff units 5 to operate, whereby a selected component is automatically dropped into a pneumatically operated component delivery chute 17. The chute 17 is constantly ready to transport a component to the component insertion head 16. Hence, as the component is dropped into the chute 17, it is automatically delivered to the component insertion head 16. A component sensing device, not shown, upon detecting a component in the insertion head 16, generates a signal which renders the component insertion head 16 operative to insert the component into the dielectric panel. The dielectric panel, after the component has been properly inserted, is automatically positioned to receive another component. The control unit then again signals one of the component supply, delivery and cutoff units 5 to operate. The process is repeated until all desired components have been inserted into the dielectric panel which is then automatically ejected into a hopper, not shown, and another dielectric panel coming from a supply magazine, not shown, is fed into position for receiving components.

Figure 2:
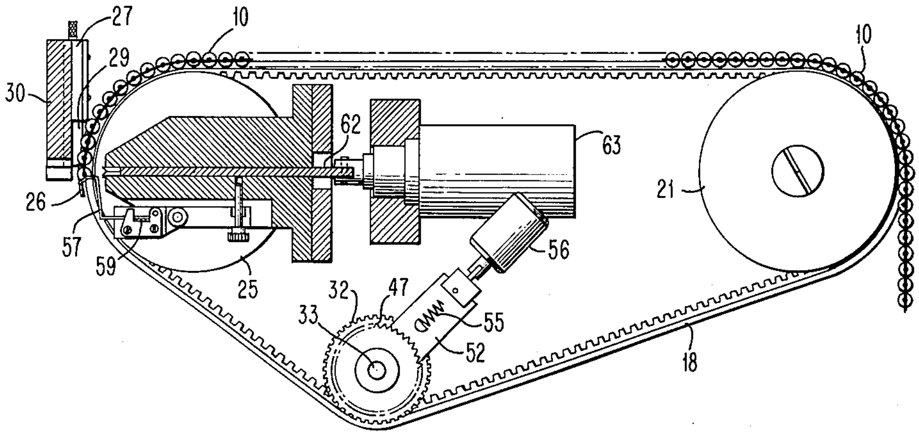
FIG. 2 is a right side elevational view showing the leading component in cutoff position with the associated electrical switch lever actuated.
Figure 7:
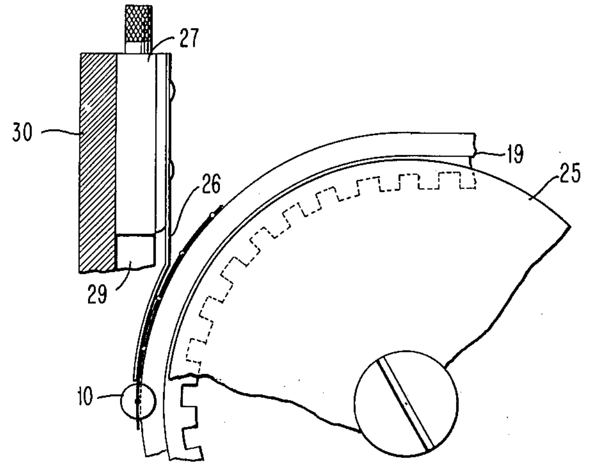
FIG. 7 is a detail view showing how the pressure plate establishes a drive between the endless belt and the belted components.

Referring again to FIG. 1, the tapes 11 and 12 are laid flat upon spaced endless belts 18 and 19, respectively. The endless belt 18 is trained about a drive pulley 20 and idler pulleys 21 and 22. The idler pulley 22 is disposed in proximity of the cutoff station S. It is seen in FIG. 1 that the pulleys 20, 21 and 22 are so arranged that the endless belt 18 assumes a triangular configuration. Similarly, the endless belt 19 is trained about a drive pulley 23 and idler pulleys 24 and 25. In order to prevent damage to the axial leads of the components 10, the leads are not engaged by any positive driving member. Rather, the belts 18 and 19 are provided with a soft rubber backing which engages the taped portions 11 and 12. The idler pulleys 22 and 25 are so positioned that the leading component is vertically tangent to the outer periphery of the belts when the component is in cutoff position, as seen in FIG. 2. The frictional drive between the outwardly facing surfaces of the endless belts 18 and 19 and the tapes 11 and 12 linking the axial leads of the components 10 is established by an arcuately shaped pressure member or leaf spring 26, FIG. 7, which is fixedly attached to a block 27 insertable by means of a thumb screw 28 into a guideway 29 of a frame 30. The pressure members 26, there being one associated with each belt 18 and 19, engage the tapes 11 and 12 covering the leads of the component, as seen best in FIG. 7.

A common driving source, not shown, is adapted to drive the drive pulleys 20 and 23, FIG. 1, through an input gear 31 meshing with a gear 32 fixed to a shaft 33 upon which the drive pulleys 20 and 23 are journaled. The drive pulley 20 is drivably connected to shaft 33 by means of a clutch 34 while the drive pulley 23 is driven by the shaft 33 through a clutch 35. The clutches 34 and 35 are spring-type clutches, the details thereof shown in FIG. 6.

The clutches 34 and 35 are identical and, therefore, only one of the clutches will be described in detail. The clutch 34, FIG. 6, includes a flanged cylindrical drive member 36 adapted to set within the drive pulley 20 and be attached thereto by any suitable fastening means such as screws 37. The drive member 36 is provided with a longitudinal axial slot 38 for receiving one end 39 of a helical spring 40 concentrically disposed within the member 36. The other end 41 of the spring 40 abuts against a depending projection 42 extending inwardly from the wall of a second flanged cylindrical driving member 43, which also receives spring 40 and a bushing 44 embraced by spring 40. The bushing 44 is secured to shaft 33 by means of set screws 46. Flange 47 of the member 43 is provided with an oblong aperture 48 for receiving a pin 49 projecting from flange 50 of the member 36. As it will be seen shortly, this slot and pin arrangement permits vernier positioning of the drive pulley 20.

Figure 6:
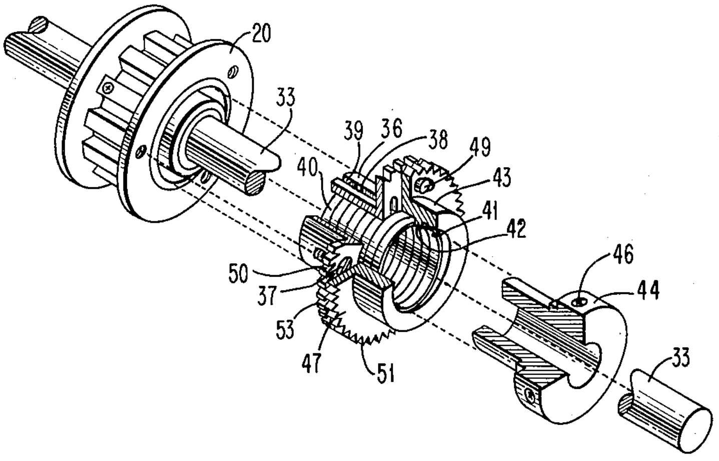
FIG. 6 is an exploded isometric view of one of the clutches for establishing a driving relationship between the continuous drive and one of the belts.

The flange 47 of the member 43 is provided with a series of serrations 51 formed in the periphery thereof which are adapted to cooperate with a detent member 52, shown in FIG. 1. Referring to FIGS. 1 and 6, the outer periphery of the flange 50 of the member 36 is provided with a series of teeth 53 which are adapted to be engaged by a drive pawl 54 for vernier positioning of the drive pulley 20.

The detent member 52 and drive pawl 54 are urged to engage the flanges 47 and 50 of drive members 43 and 36, respectively, by means of a spring 55, FIG. 1. Consequently, the leads of the components 10 are accurately positioned at the cutoff station S.

It is thus seen that the continuous drive attempts to continuously rotate the drive pulleys 20 and 23 through clutches 34 and 35, respectively. However, the drive pulleys 20 and 23 will not rotate when detented. Spring 55 urges the members 52 and 54 into engagement with the flanges of members 43 and 36 when solenoid 56 is de-energized.

The solenoid 56 is de-energized when the lead component is driven into cutoff position, as seen in FIG. 2. The axial leads of the component operate levers 57 and 58 of electrical switches 59 and 60, respectively. When the levers 57 and 58 of electrical switches 59 and 60 are operated by the leads of the component, normally closed contacts of the electrical switches 59 and 60 are opened, thereby de-energizing solenoid 56 and solenoid 61, in FIG. 4. With the solenoid 56 de-energized, spring 55 moves the elements 52 and 54 into position to detent the drive pulley 20 and also vernierly position the same. Hence, the leading component is in final position for cutoff by means of a reciprocable punch element or cutoff member 62 actuated by a selectively operable pneumatic cylinder 63.

Figure 5:
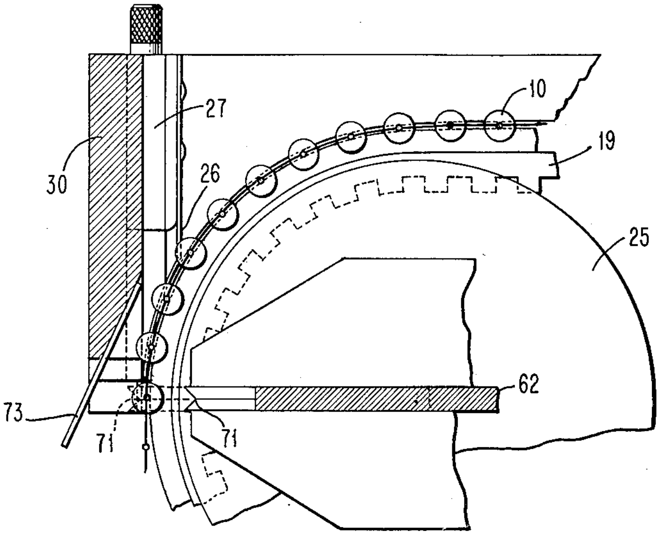
FIG. 5 is an enlarged view partially in section showing the components at cutoff position.
Figure 9:
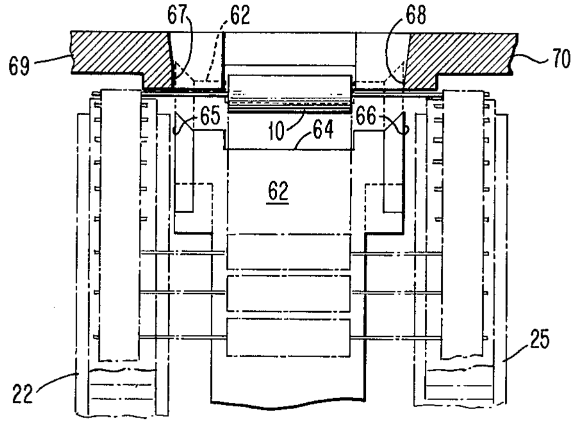

The pneumatic cylinder 63 is selectively operable and is operated whenever the particular component associated with the particular cutoff member 62 is to be delivered to the component insertion head 16, shown schematically in FIG. 8. The cutoff member 62, as seen in FIGS. 1 and 9, has a recessed portion 64 for receiving the body portion of the component 10 in cutoff position while the member 62 advances to sever the leads. The axial leads of the component 10 are severed as outer sides 65 and 66 of the cutoff member 62 pass relative to inner edges 67 and 68 of die members 69 and 70, respectively. The leading portions of sides 65 and 66 are provided with V-shaped notches 71, as seen in FIG. 5. The V-shaped notches 71 function to center the leads of the component prior to cutting and to minimize the burr forged by cutting. As the member 62 severs the leads of the component 10, the component 10 is carried forward and deflected downward by a deflector 73, FIG. 5, into the pneumatically operated component delivery chute 17, as seen in FIG. 1. The component is then delivered by the chute 17 to the component insertion head 16, schematically shown in FIG. 8.

Figure 3:
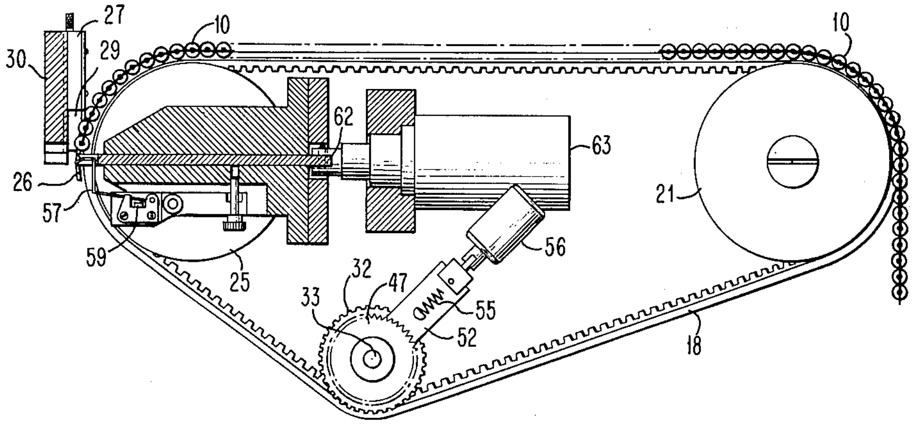
FIG. 3 is a right side elevational view showing the position of the electrical switch lever just after the leading component has been severed.
Figure 4:
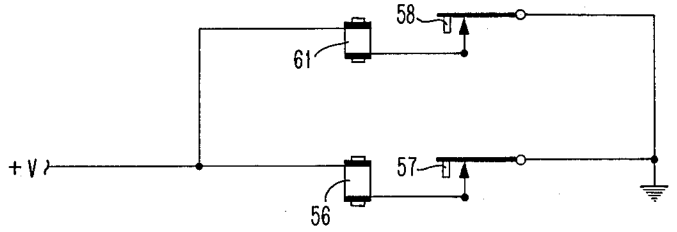
FIG. 4 is a schematic view of the circuit diagram for the electrical switches and solenoids.

With the leads of the component severed and the component carried to the pneumatic delivery chute 17, the levers 57 and 58 of the electrical switches 59 and 60 are returned to their normal position, as seen in FIG. 3; hence, solenoids 56 and 61, FIG. 4, become energized to retract members 52 and 54 to permit the drive pulleys 20 and 23 to be driven through clutches 34 and 35, respectively. With the drive being engaged with the drive pulleys 20 and 23, the belts 18 and 19 are driven to advance the new leading component into cutoff position S. With the new leading component in cutoff position, electrical switches 59 and 60 are operated and the solenoids 56 and 61, FIG. 4, again are de-energized, thereby permitting the spring 55, FIG. 1, to urge the members 52 and 54 into engagement with members 43 and 36, respectively.

From the foregoing, it is seen that the invention provides for transporting axial lead components linked together by tapes adherent to the leads therof from a supply reel to a cutoff station. The components are transported without damage to the leads thereof because of the friction drive. Any component misaligned by the tapes adherent to the leads thereof is automatically aligned at the cutoff station because of the independent drives acting upon each axial lead of the component.

While the invention has been particularly shown and described with reference to a preferred embodiment thereof, it will be understood by those skilled in the art that various changes in form and details may be made therein without departing from the spirit and scope of the invention.

What is claimed is:

1. In an arrangement of apparatus for transporting axial lead components linked in spaced relationship by tapes adhering to the leads to a station for severing the component leads from the tapes, a pair of parallel spaced endless belts having a resilient outwardly facing surface for engaging said tapes linking the components to advance the same along a predetermined path to said station for severing the components from the tapes, means for establishing a frictional driving relationship between the outwardly facing surface of said endless belts and the tapes linking the axial leads of said components, means for independently driving each endless belt so as to independently bring the leads of each component while the same are adherent to said tapes into cutoff position and belt-drive control means operably responsive to the presence of said component leads in said cutoff position to stop the driving of said belts and to start the driving of said belts in the absence of said leads in said cutoff position.

2. In an arrangement of apparatus for transporting axial lead components linked in spaced relationship by tapes adherent to the leads to a station for severing the component leads from the tapes, a pair of endless belts mounted for movement and having a resilient outwardly facing surface spaced from each other to engage said tapes linking the components to advance the same along a predetermined path to said station for severing the components from the tapes, means for establishing a frictional driving relationship between the outwardly facing surface of said endless belts and said tapes linking the axial leads of said components, a constantly rotating driving source, a first drive pulley for driving one of said endless belts, a first selectively operable clutch for selectively coupling said first drive pulley with said driving source, a first selectively operable brake associated with said first drive pulley to hold the same against movement when uncoupled from said driving means, a second drive pulley for driving the other endless belt of said pair of endless belts, a second selectively operable clutch for selectively coupling said second drive pulley with said driving source, a second selectively operable brake associated with said second drive pulley to hold the same against movement when uncoupled from said driving means, means for selectively operating said first and second clutches whereby said leads are driven into cutoff position, and means for selectively operating said first and second brakes whereby said leads are held in said cutoff position.

3. In an arrangement of apparatus for transporting axial lead components linked in spaced relationship by tapes adherent to the leads to a station for severing the component leads from the tapes as in claim 2 wherein said first and second clutches are spring-type clutches which constantly tend to establish a driving relationship between said drive source and said first and second drive pulleys and do establish such a driving relationship when permitted by said first and second selectively operable brakes.

4. In an arrangement of apparatus for transporting axial lead components linked in spaced relationship by tapes adherent to the leads to a station for severing the component leads from the tapes as in claim 2 wherein said means for establishing a frictional driving relationship between the outwardly facing surface of said endless belts and said tapes linking the axial leads of said components comprise a flat spring disposed to engage each tape so as to urge the same against the belt in contact therewith.

5. Apparatus for transporting axial lead components linked in spaced relationship by tapes adherent to the leads thereof to a cutoff station comprising a pair of endless belts mounted for movement in predetermined paths, means for establishing a driving relationship between said endless belts and said tapes, first and second drive means for independently driving said belts, and drive control means for controlling said first and second drive means so as to independently arrest the same whereby said leads are brought into an aligned condition at the cutoff station.

References Cited in the file of this patent

UNITED STATES PATENTS

| | | |
|---|---|---|
| 2,209,220 | Berry | July 23, 1940 |
| 2,854,054 | Cross | Sept. 30, 1958 |
| 2,908,909 | Stolecki et al. | Oct. 20, 1959 |